(12) United States Patent
Yin

(10) Patent No.: US 10,801,103 B2
(45) Date of Patent: Oct. 13, 2020

(54) EVAPORATION DEVICE AND EVAPORATION METHOD USING THE SAME

(71) Applicants: BOE TECHNOLOGY GROUP CO., LTD., Beijing (CN); CHENGDU BOE OPTOELECTRONICS TECHNOLOGY CO., LTD., Chengdu, Sichuan Province (CN)

(72) Inventor: Zhizhong Yin, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 194 days.

(21) Appl. No.: 15/865,583

(22) Filed: Jan. 9, 2018

(65) Prior Publication Data
US 2018/0355476 A1    Dec. 13, 2018

(30) Foreign Application Priority Data
Jun. 12, 2017    (CN) .......................... 2017 1 0439046

(51) Int. Cl.
*C23C 14/04*    (2006.01)
*C23C 14/56*    (2006.01)
(Continued)

(52) U.S. Cl.
CPC .......... *C23C 14/568* (2013.01); *C23C 14/042* (2013.01); *C23C 14/24* (2013.01);
(Continued)

(58) Field of Classification Search
None
See application file for complete search history.

(56) References Cited

U.S. PATENT DOCUMENTS 4,042,128 A  *  8/1977  Shrader ................. C23C 14/568
                                                    414/287
6,340,501 B1 *  1/2002  Kamiyama ............. C23C 14/12
                                                    118/715
(Continued)

FOREIGN PATENT DOCUMENTS

CN          1804112 A      7/2006
CN        102056360 A      5/2011
(Continued)

OTHER PUBLICATIONS

First Office Action dated Nov. 2, 2018 corresponding to Chinese application No. 201710439046.7.

*Primary Examiner* — Charles Capozzi
(74) *Attorney, Agent, or Firm* — Nath, Goldberg & Meyer; Joshua B. Goldberg

(57) ABSTRACT

The present disclosure provides an evaporation device and an evaporation method using the same. The evaporation device includes at least one evaporation line, a first delivery track, and a tray. The evaporation line includes an evaporation chamber including a plurality of evaporation sub-chambers connected in sequence, an inlet of the evaporation line is formed at one end of the evaporation chamber, an outlet is formed at the other end, and an evaporation source component is provided in the evaporation sub-chamber; a track arranged between the inlet and outlet of evaporation line, the first delivery is located above the evaporation source component; and a tray for placing a workpiece, the tray being movably provided on the first delivery track can be movable between the inlet and the outlet of the evaporation line to deliver the workpiece so as to form deposition on the workpiece by evaporation source component.

16 Claims, 5 Drawing Sheets

(51) Int. Cl.
  *H01L 51/56* (2006.01)
  *C23C 14/54* (2006.01)
  *C23C 28/00* (2006.01)
  *C23C 14/24* (2006.01)
  *H01L 51/00* (2006.01)
  *C23C 14/52* (2006.01)

(52) U.S. Cl.
  CPC .............. *C23C 14/52* (2013.01); *C23C 14/54* (2013.01); *C23C 28/00* (2013.01); *H01L 51/001* (2013.01); *H01L 51/56* (2013.01)

(56) References Cited

U.S. PATENT DOCUMENTS

| | | | | |
|---|---|---|---|---|
| 2003/0232563 | A1* | 12/2003 | Kamiyama | C23C 14/568 445/24 |
| 2006/0011136 | A1* | 1/2006 | Yamazaki | C23C 14/042 118/719 |
| 2017/0204510 | A1* | 7/2017 | Fujinaga | C23C 14/3464 |

FOREIGN PATENT DOCUMENTS

| | | |
|---|---|---|
| CN | 103255375 A | 8/2013 |
| CN | 104726827 A | 6/2015 |
| CN | 105525256 A | 4/2016 |
| TW | 200516160 A | 5/2005 |
| TW | I261627 B | 9/2006 |

* cited by examiner

EVAPORATION DEVICE AND EVAPORATION METHOD USING THE SAME

CROSS-REFERENCE TO RELATED APPLICATION

This application claims the priority of China Patent Application No. 201710439046.7, filed in China on Jun. 12, 2017, the entire contents of which are hereby incorporated by reference.

TECHNICAL FIELD

The present disclosure relates to the field of evaporation technologies, and in particular, to an evaporation device and an evaporation method using the same.

BACKGROUND

In related technologies, evaporation sub-chambers in an evaporation system are located on both sides of a delivery device, and are rotated through robot arms to deliver the workpieces between the evaporation sub-chambers or between the evaporation sub-chamber and a delivery chamber.

SUMMARY

An object of the present disclosure is to provide an evaporation device.

Another object of the present disclosure is to provide an evaporation method of the evaporation device.

The evaporation device of the present disclosure includes at least one evaporation line, which includes an evaporation chamber including a plurality of evaporation sub-chambers connected in sequence, an inlet of the evaporation line being formed on one end of the evaporation chamber, an outlet of the evaporation line being formed on the other end of the evaporation chamber, and an evaporation source component being provided in the evaporation chamber; a first delivery track, which is arranged between the inlet of the evaporation line and the outlet of the evaporation line, the first delivery track being located above the evaporation source component; and a tray for placing the workpiece, which is movably provided on the first delivery track to deliver the workpiece between the inlet of the evaporation line and the outlet of the evaporation line so as to form deposition on the workpiece by the evaporation source component.

The evaporation device further comprises a second delivery track provided outside the evaporation chamber, the second delivery track and the first delivery track forming an annular track so as to allow the tray to circularly move between the inlet of the evaporation line and the outlet of the evaporation line.

A plurality of evaporation lines are formed, the second delivery track is connected between two adjacent evaporation lines, one end of the second delivery track is connected to the outlet of the evaporation line of either one of the two adjacent evaporation lines, and the other end of the second delivery track is connected to the inlet of the evaporation line of the other one of two adjacent evaporation lines, such that the plurality of evaporation lines form the annular track.

The evaporation line further comprises an inlet transition chamber located at an upstream of the inlet of the evaporation line, at least one first alignment mechanism being provided between the inlet transition chamber and the inlet of the evaporation line, and the first alignment mechanism being configured to pre-align the workpiece.

The evaporation line further comprises a mask plate provided between the workpiece and the evaporation source component; and a second alignment mechanism provided in at least one of the evaporation sub-chambers, and configured to position the workpiece so as to align an area of the workpiece on which the deposition is formed with a pattern of the mask plate.

The second alignment mechanism comprises an alignment plate located above the first delivery track and provided with at least one alignment portion extending downwardly; a controller connected to the alignment plate and configured to control movement of the alignment plate so as to position the workpiece by the alignment portion; and an elastic adjustment mechanism provided at bottom of the tray.

Two alignment portions are arranged at an interval, surfaces of the two alignment portions on the sides facing to each other extending obliquely in a direction far away from each other in an up and down direction.

The second alignment mechanism further comprises an image collector connected to the controller for obtaining a relative position of the workpiece in relation to the mask plate by collecting an image in the evaporation sub-chambers.

The evaporation line further comprises a plurality of mask plate chambers, a plurality of mask plates being provided in each of the plurality of mask plate chambers, the plurality of mask plate chambers corresponding to the plurality of evaporation sub-chambers one by one, a connected passage being provided between the mask plate chambers and their corresponding evaporation sub-chambers, and the mask plates being movable in the connected passage so as to replace the mask plates in the evaporation sub-chambers; and a replacement device movable between the mask plate chambers and their corresponding evaporation sub-chambers, and configured to remove the mask plate in the evaporation sub-chamber and transport the mask plate in the evaporation sub-chamber to the evaporation sub-chamber so as to replace the mask plate in evaporation sub-chamber.

The replacement device comprises a push-pull rod movable between the mask plate chambers and their corresponding evaporation sub-chambers, a fitting hole being provided on a side wall of the mask plate adjacent to the push-pull rod such that the push-pull rod is able to insert into the fitting hole so as to draw the mask plate.

A shelf is provided in the mask plate chambers and movable in an up and down direction relative to the mask plate chambers, and the shelf has a plurality of supporting tracks which are provided on two opposite surfaces of the shelf at an interval in a vertical direction.

The supporting tracks have a roller which slidably supports the mask plate.

The tray further comprises a bracket for placing the workpiece; and a side edge connected to an outer periphery of the bracket, wherein an upper surface of the workpiece is lower than an upper end surface of the side edge.

The evaporation source component in at least one of the evaporation sub-chambers comprises a plurality of evaporation sources, and at least one of the plurality of evaporation sources is a standby evaporation source.

At least one of the first delivery track and the second delivery track includes a ball bearing guide screw.

An arrangement of the plurality of evaporation sub-chambers of at least one evaporation line is selected from a group consisting of: a straight line, a zigzag line or a honeycomb ringed shape.

The annular track is formed as a polygonal track.

A shape of the polygonal track is selected from a group consisting of: square, pentagonal, and hexagonal shape.

An evaporation method for the evaporation device according to the present disclosure comprises steps of: placing the workpiece on the tray located at the inlet of the evaporation line; driving the workpiece into the evaporation chamber along with the tray and moving through the plurality of evaporation sub-chambers successively so as to form the deposition on the workpiece; operating the deposited workpiece to move to the outlet of the evaporation line along with the tray; and removing the deposited workpiece from the tray and transporting it to a next process.

Additional aspects and advantages of the present disclosure will be partially provided and they will become more apparent from the description or through the embodiments of the present disclosure hereinafter.

BRIEF DESCRIPTION OF THE DRAWINGS

The foregoing and/or additional aspects and advantages of the present disclosure will become more apparent and comprehensible in view of the detailed description of the embodiments in conjunction with the accompanying figures, wherein.

DETAILED DESCRIPTION OF THE EMBODIMENTS

Figure 1:
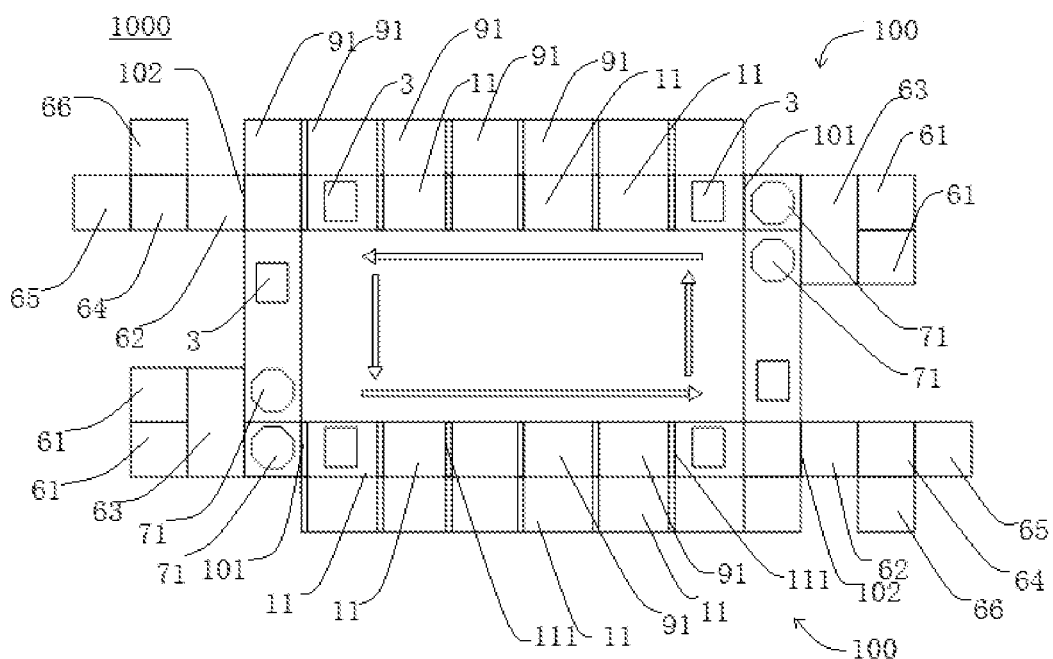
FIG. 1 is a schematic diagram of a production line layout of an evaporation device according to an embodiment of the present disclosure.

Embodiments of the present disclosure will be described hereinafter in detail, and the examples of the embodiments will be shown in the accompanying drawings, wherein the same or similar reference numeral indicates the same or similar element or element with the same or similar function throughout the description. The embodiments described hereinafter with the reference to the accompanying drawings, are exemplary embodiments provided only for illustrating the present disclosure and are not intended to be constructed as limiting of the present disclosure.

In the description of the present disclosure, it is to be understood that those terms indicating the orientation or the positional relationship such as 'center', 'longitudinal', 'transverse', 'length', 'width', 'thickness', 'up', 'down', 'front', 'rear', 'left', 'right', 'vertical', ' horizontal', 'top', 'bottom', 'inside', 'outside', are on the basis of the orientation and positional relationship shown in the accompanying drawings. The terms used herein merely for the purpose of describing the present disclosure and simplifying the description, rather than indicating or implying that the involved device or element should have a specific orientation, or be constructed and operated in a specific orientation. Therefore the present disclosure is not limited thereto. In addition, features defined as "first" and "second" may explicitly or implicitly include one or more of the features.

In the description of the present disclosure, it should be noted that the terms 'install', 'connected' and 'connect' are constructed in general understandings unless otherwise expressly stated and limited. For example, 'connection' can include 'fixed connection', 'removable connection', 'integral connection', or 'mechanically connected', 'electrically connected', or direct connection or indirect connection via an intermediate medium or internal connection between elements. For those ordinary skilled in the art, the specific meanings of the above terms in the present disclosure may be understood according to specific circumstance.

An evaporation device 1000 according to an embodiment of the present disclosure will be described hereinafter with reference to FIGS. 1 to 7. Herein, the evaporation device 1000 may be a vacuum evaporation device 1000. Vacuum evaporation technology is an important process in the manufacturing of OLED (Organic Light-Emitting Diode, abbreviated as OLED) display screens, which is mainly operated in a vacuum environment, wherein the small molecule materials and metal materials (such as Mg, Ag, etc.) are heated and evaporated onto a workpiece 4.

Figure 2:
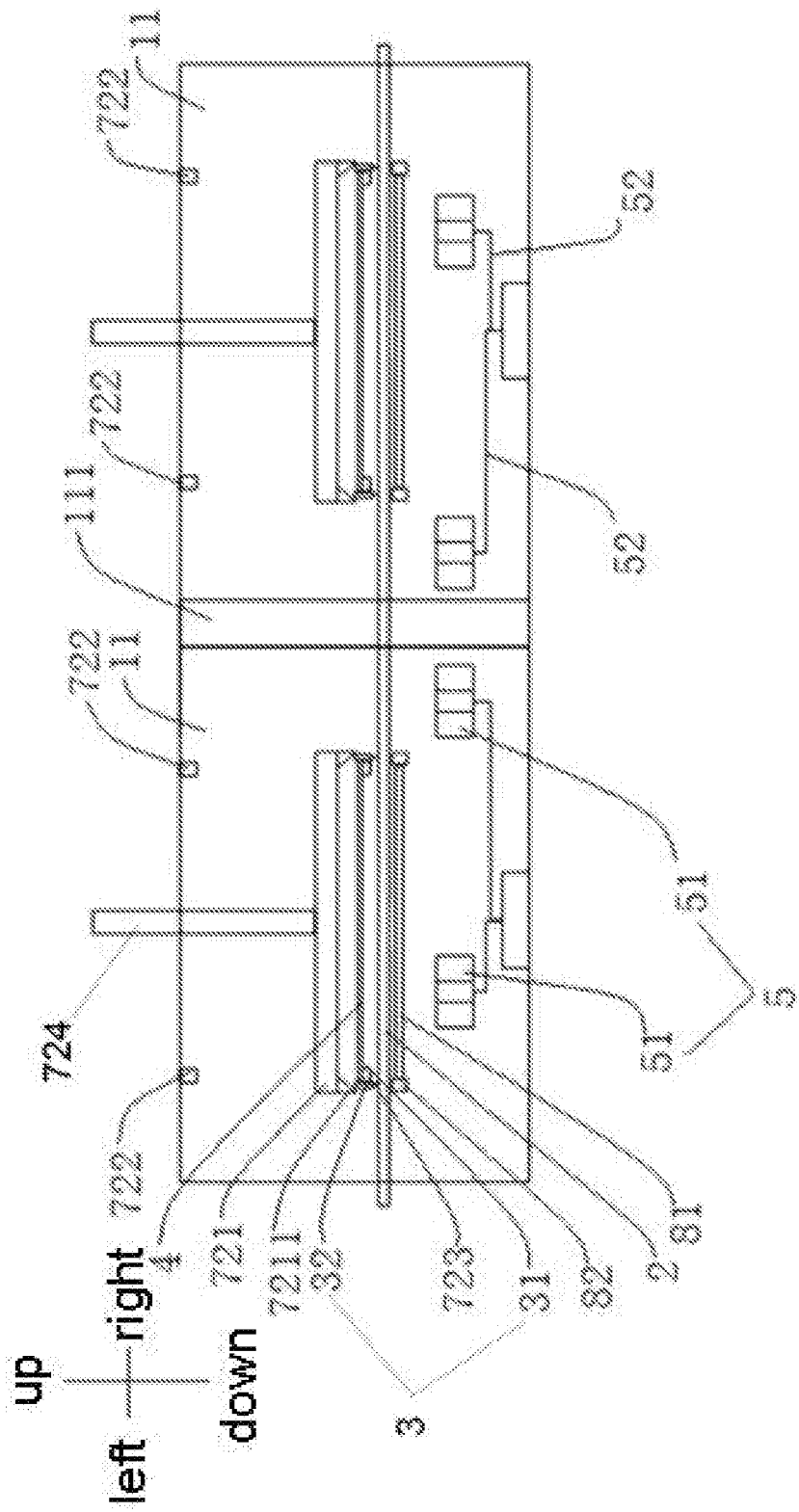
FIG. 2 is a partial side view of an evaporation chamber according to an embodiment of the present disclosure.

As shown in FIGS. 1 and 2, the evaporation device 1000 according to an embodiment of the present disclosure comprises at least one evaporation line 100, a first delivery track 2 and a tray 3. Herein, there may be one evaporation line 100 or a plurality of evaporation lines 100. In the description of the present disclosure, however, 'a plurality of evaporation lines' means two or more evaporation lines unless otherwise specified.

In particular, each of the evaporation lines 100 includes an evaporation chamber having a plurality of evaporation sub-chambers 11 in connection with one another in sequence. A vacuum environment is formed in each of the evaporation sub-chambers 11. As shown in FIG. 1, the sidewall of two adjacent evaporation sub-chambers 11 may be connected to each other, or the two adjacent evaporation sub-chambers 11 may share one sidewall. Therefore, a gap between the evaporation sub-chambers 11 can be reduced to allow for a more compact structure of the evaporation device 100, thereby improving the space utilization to reduce the space occupied by the whole evaporation chamber and providing a relatively appropriate layout of the evaporation line 100.

Optionally, the evaporation sub-chambers 11 can be formed in a polygonal shape. As shown in the example of FIG. 1, for example, the evaporation sub-chambers 11 can also be formed in a rectangular parallelepiped shape. As a matter of course, it can be understood by those skilled in the art that the evaporation sub-chambers 11 can also be formed in shapes as a pentahedron, a hexahedron, etc.

An inlet 101 of the evaporation line is formed at one end of the evaporation chamber, and an outlet 102 of the evaporation line is formed at the other end of the evaporation chamber. An evaporation source component 5 is provided in each of the evaporation sub-chambers 11. The evaporation source component 5 can move (e.g., in a horizontal direction) inside the evaporation sub-chamber 11 to form deposition on the workpiece 4. Herein, the evaporation source components 5 in each of the evaporation sub-chambers 11 may deposit a respective functional thin film layer (e.g., an electron injection layer, a light-emitting layer, etc.) on the workpiece 4.

A first delivery track 2 is arranged between the inlet 101 of the evaporation line and the outlet 102 of the evaporation line. The first delivery track 2 passes through the evaporation chamber from the inlet 101 of the evaporation line to the outlet 102 of the evaporation line, such that the first delivery track 2 is arranged inside the evaporation chamber above the evaporation source component 5. A tray 3 on which the workpiece 4 is placed is movably provided on the first delivery track 2 to deliver the workpiece 4 between the inlet 101 of the evaporation line and the outlet 102 of the evaporation line such that the evaporation source component 5 deposits on the workpiece 4. As a result, the workpiece 4 can be moved on the first delivery track 2 by means of the tray 3, so as to be delivered between the evaporation sub-chambers 11 without any mechanical manipulators in the related art for delivering the workpiece 4 between the evaporation sub-chambers 11 and the delivery process between the evaporation sub-chambers 11 using the mechanical manipulators. Thus, it is possible to simplify the operative steps, decrease the risk of damaging the workpiece 4 during the delivery process, and reduce the deviation of the workpiece 4 from the normal evaporation position. This in turn can reduce the difficulty of the aligning process, save the space occupied by the mechanical manipulators, and greatly lower the occupied space of the whole evaporation device 1000 and the cost of the evaporation device 1000.

Figure 3:
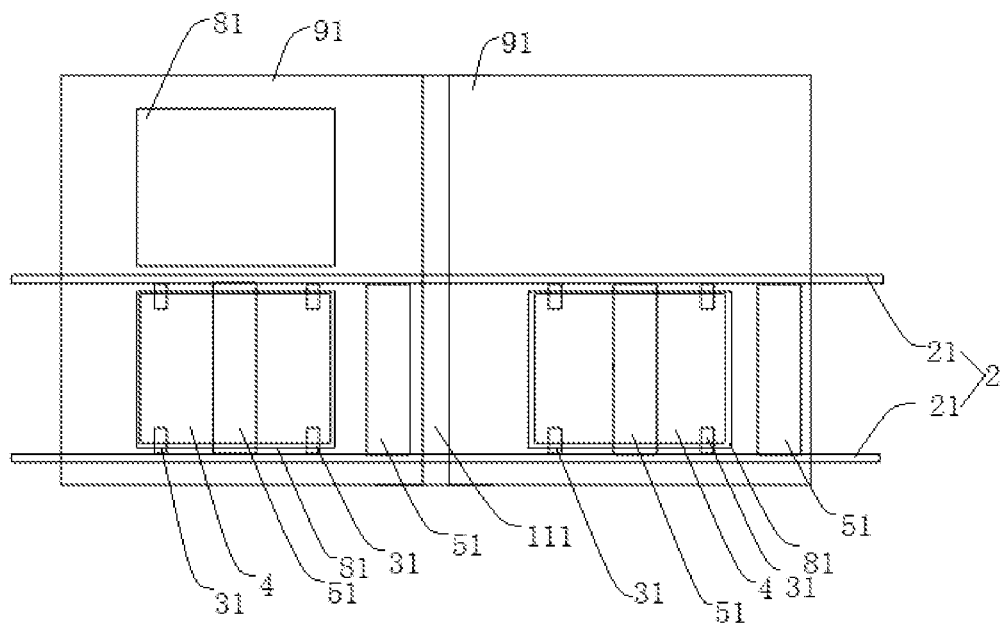
FIG. 3 is a partial top view of the evaporation chamber according to the embodiment of the present disclosure.

Specifically, referring to FIGS. 2 and 3, the first delivery track 2 may include two sub-tracks 21 in parallel to each other. In some embodiments of the present disclosure, the tray 3 includes a bracket for placing the workpiece 4. The bracket may include a plurality of sub-brackets 31 which form a frame at an interval from each other. The frame has a shape fitting to an outline of the workpiece 4. For example, in the example of FIG. 3, the workpiece 4 may be formed in a generally rectangular shape, while the bracket includes four sub-brackets 31 which form a rectangular frame. Four corners of the workpiece 4 are supported on the sub-brackets 31, respectively. Thereby, the workpiece 4 can be stably supported by the frame such that a to-be-deposited area of the workpiece 4 can be exposed for the convenience of the evaporation-deposition.

In other embodiments of the present disclosure, the bracket may also be formed as a one-piece frame structure (not shown). For example, the bracket may be formed as an integral rectangular frame. In this way, the work piece 4 can also be stably supported on the bracket, such that the to-be-deposited area of the workpiece 4 can be exposed for the convenience of the evaporation-deposition.

For example, in the evaporation-deposition process, the workpiece 4 may be placed on a bracket of an empty tray 3 at the inlet 101 of the evaporation line, and the workpiece 4 can be moved along with the tray 3 on the first delivery track 2, from the inlet 101 of the evaporation line through to the outlet 102 of the evaporation line, such that the evaporation source components 5 in evaporation sub-chambers 11 form deposition on the workpiece 4 in sequence to complete the evaporation-deposition process. Subsequently, the workpiece 4 is removed from the tray 3 at the outlet 102 of the evaporation line to proceed with a next process. Herein, the next process may include a packaging process 65 or a detecting process 66.

In particular, a first mechanical manipulator 63 may be disposed at the inlet 101 of evaporation line, and a second mechanical manipulator 64 may be disposed at the outlet 102 of the evaporation line. The first mechanical manipulator 63 may place a to-be deposited workpiece 4 on an empty tray 3. The second mechanical manipulator 64 may remove a deposited workpiece 4 from the tray 3 and transport the deposited workpiece 4 to the next process.

According to the evaporation device 1000 in the embodiment of the present disclosure, the plurality of evaporation sub-chambers 11 in the evaporation chamber are sequentially connected to each other, and the first delivery track 2 and the tray 3 are provided in the evaporation device 1000, such that the workpieces 4 can be moved on the first delivery track 2 by means of the tray 3 so as to be delivered between the evaporation sub-chambers 11 without any mechanical manipulators in the related art for delivering the workpiece 4 between the evaporation sub-chambers 11 and the delivery process between the evaporation sub-chambers 11 using the mechanical manipulators. Thus, it is possible to simplify the operative steps, decrease the risk of damaging the workpiece 4 during the delivery process, and reduce the deviation of the workpiece 4 from the normal evaporation position. This in turn can reduce the difficulty of the aligning process, while optimizing the layout of the evaporation line 100, improving the space utilization efficiency, allowing for a more compact structure and a more appropriate layout of the evaporation line 100, and reducing the overall occupied space and cost of the evaporation device 1000.

According to the embodiments of the present disclosure, the plurality of evaporation sub-chambers 11 of the at least one evaporation line 100 are arranged in a straight line (linear shape) or in a zigzag line.

Specifically, the plurality of evaporation sub-chambers 11 of the at least one evaporation line 100 in the evaporation device 1000 are arranged in a straight line. For example, referring to FIGS. 2 and 3, each of the evaporation sub-chambers 11 is formed into a rectangular parallelepiped shape, and the sidewalls of the plurality of evaporation sub-chambers 11 are sequentially connected and arranged in a straight line. Accordingly, the first delivery track 2 is formed linearly. As an alternative, the plurality of evaporation sub-chambers 11 of the at least one evaporation line 100 in the evaporation device 1000 may be arranged in a zigzag line. For example, the plurality of evaporation sub-chambers 11 may be arranged in a substantial L-shape and Z-shape. In this case, the first delivery track 2 may include a plurality of straight line segments connected in sequence.

Thereby, the gap between two adjacent evaporation sub-chambers 11 can be reduced, so as to allow for the evaporation chamber having a more compact structure, and the space utilization can be improved. In the meanwhile, the tray 3 can always be moved in a line on the first delivery track 2 so that the workpiece 4 can be linearly delivered between the evaporation sub-chambers 11, thereby effectively avoiding the sliding of the workpiece 4 in relation to the tray 3. Therefore, it is possible to decrease the deviation between the workpiece 4 and the normal evaporation position, reduce the difficulty of the alignment process, facilitate the reduction of the number of the alignment mechanisms, in turn reduce the space occupied by the alignment mechanism, simplify the structure of the evaporation device 1000, and lower the cost of the evaporation device 1000. Further, it is possible to effectively avoid the damage or even fragment of the workpiece 4 during the alignment process, and thus the product quality can be improved. In the meanwhile, the static electricity generated due to the relative sliding between the workpiece 4 and the tray 3 can be reduced, and thus various abnormal phenomena caused by the static electricity (for example, the fragment of the workpiece 4 and the damage of the mask plate 81, etc.) can be avoided, thereby ensuring the safety of manufacturing.

In addition, in the evaporation-deposition process, in order to keep a rate of the evaporation source component 5 stable, the evaporation source component 5 always remains in a state of evaporation throughout the evaporation-deposition process, no matter whether the deposition is form on the workpiece 4 or not. In other words, the evaporation source component 5 is in continuous operation during the evaporation-deposition process. Therefore, compared to the related art, the evaporation device 1000 of the present disclosure can reduce the sliding of the workpiece 4 and ensure safety of manufacturing by restricting the movement rate of the workpiece 4, thus lowering the average operation time of the workpiece 4 and further reducing the consumption of a single workpiece 4 to the expensive evaporation source material so that the cost of material can be cut down.

In other embodiments of the present disclosure, the plurality of evaporation sub-chambers 11 of the at least one evaporation line 100 may also be arranged in a honeycomb ringed shape. Specifically, the plurality of evaporation sub-chambers 11 of at least one evaporation line 100 in evaporation device 1000 are arranged in a honeycomb ringed shape. For example, each of the evaporation sub-chambers 11 may be formed in a hexagonal shape, and sidewalls of the plurality of evaporation sub-chambers 11 are sequentially connected to form an annular structure. At this point, the first delivery track 2 may include a plurality of straight line segments connected in sequence. Therefore, the gap between the two adjacent evaporation sub-chambers 11 can also be reduced to improve the space utilization rate and ensure that a movement trajectory of the tray 3 in the evaporation sub-chambers 11 forms a substantial line.

As a matter of course, it can be understood that the plurality of evaporation sub-chambers 11 of the at least one evaporation line 100 may also be arranged in a square shape, for example. The specific arrangement thereof may be adjusted according to the actual practice, which is not specifically limited in the present disclosure.

According to some embodiments of the present disclosure, the evaporation device 1000 further includes a second delivery track (not shown), and the second delivery track is provided outside the evaporation chamber in such a manner that the second delivery track and the first delivery track 2 form an annular track to allow the tray 3 to cyclically move between the inlet 101 of evaporation line and the outlet 102 of evaporation line. Thus, the tray 3 can be cyclically moved between the inlet 101 of evaporation line and the outlet 102 of evaporation line by the annular track, such that the tray 3 can be recycled to improve the automation and production efficiency of the evaporation line 100.

For example, in a specific embodiment of the present disclosure, the evaporation line 100 is a single evaporation line, the second delivery track is provided outside the evaporation chamber of the evaporation line 100, and both ends of the second delivery track in zigzag form are connected to both ends of evaporation line 100 in the straight line, respectively. In other words, both ends of the second delivery track in zigzag are connected to the inlet 101 and the outlet 102 of the evaporation line 100, respectively, and thus the second delivery track and the first delivery track of the evaporation line 100 can form an annular track.

In another embodiment of the present disclosure, the number of the evaporation lines 100 is a plurality, the second delivery track is connected between the two adjacent evaporation lines 100, and specifically, one end of the second delivery track is connected to the outlet 102 of one of the two adjacent evaporation lines 100, while the other end is connected to the inlet 101 of the other one of the two adjacent evaporation lines 100 to form a annular track between the plurality of evaporation lines 100.

For convenience of description, one of the two adjacent evaporation lines 100 is referred to as a "first evaporation line", and the other one of the two adjacent evaporation lines 100 is referred as a "second evaporation line". Specifically, one end of the second delivery track is connected to the outlet 102 of the first evaporation line, and the other end of the second delivery track is connected to the inlet 101 of the second evaporation line. Therefore, the first delivery track 2 and the second delivery track of the plurality of evaporation lines 100 can be combined together to form an annular track, so that the tray 3 can be circularly moved between the plurality of evaporation lines 100 in the entire evaporation device 1000, thereby improving the utilization rate of the tray 3 and improving the automation and production efficiency of the evaporation lines 100.

For example, when the tray 3 is moved to the inlet 101 of the first evaporation line, the to-be-deposited workpiece 4 may be placed on the bracket of the tray 3, and the to-be-deposited workpiece 4 is moved along evaporation sub-chambers 11 of the first evaporation line with the tray 3 to form deposition thereon. When the tray 3 is moved to the outlet of the first evaporation line, the deposited workpiece 4 can be removed from the tray 3, and the tray 3 is empty by then. Subsequently, the tray 3 can move to the inlet 101 of the second evaporation line through the second delivery track. When the tray 3 is moved to the inlet 101 of the second evaporation line, another to-be-deposited workpiece 4 can be placed on the bracket of the tray 3 and moved along the evaporation sub-chambers 11 of the second evaporation line with the tray 3 to form the deposition on the workpiece 4. When the tray 3 is moved to the outlet of the second evaporation line, the deposited workpiece 4 can be removed from the tray 3, allowing the tray 3 to move to the next evaporation line 100 through the second delivery track.

According to other specific embodiments of the present disclosure, the second delivery track is connected between the outlet 102 and the inlet 101 of each evaporation line 100 to form an annular track within each evaporation line 100. Herein, one or more evaporation lines 100 may be provided. For example, when the tray 3 is moved to the inlet 101 of the evaporation line 100, the to-be-deposited workpiece 4 may be placed on the bracket of the tray 3 and moved along the evaporation sub-chambers of the evaporation line 100 with the tray 3 to form the deposition on the workpiece 4. When the tray 3 is moved to the outlet 102 of the evaporation line 100, the deposited workpiece 4 can be removed from the tray 3. At this point, the tray 3 is an empty tray 3, and can be moved to the inlet 101 of the evaporation line 100 through the second delivery track to be reused. As a result, the tray 3 can also be recycled to improve the utilization rate of the tray 3 and also to improve the automation and production efficiency of the evaporation line 100.

Optionally, the annular track is formed as a polygonal track. For example, the annular track may be formed in a square, pentagonal, and hexagonal shape. As a result, the movement trajectory of the tray 3 in the evaporation device 1000 can be formed in straight line or substantially straight line. Therefore, it is possible to facilitate the control for the movement of the tray 3 on the first delivery track 2 and the second delivery track, further avoid the sliding of the tray 3 in relation to the workpiece 4, decrease the deviation between the workpiece 4 and the normal evaporation position, further reduce the difficulty of the alignment process and the number of the alignment mechanisms, further simplify the structure the evaporation device 1000, provide a reduced cost of the evaporation device, effectively avoid the damage or even fragment of the workpiece 4 during the alignment process, and improve the quality of the product. In the meanwhile, the static electricity generated due to the sliding of the workpiece 4 in relation to the tray 3 can be reduced, and various abnormal phenomena caused by static electricity (for example, the fragment of the workpiece 4 and the damage of the mask 81) can be avoided, thereby ensuring the safety of manufacturing.

According to a specific embodiment of the present disclosure, the first delivery track 2 and the second delivery track of the plurality of evaporation lines 100 form a square annular track. Herein, two, three or four evaporation lines 100 may be provided. Thereby, the tray 3 can always be kept in a linear movement so as to facilitate the control for the movement of the tray 3 on the first delivery track 2 and the second delivery track.

For example, in the example of FIG. 1, there are provided two evaporation lines 100. The evaporation chambers having the two evaporation lines 100 are parallel to each other, and moving directions of the workpieces 4 in the two evaporation lines 100 are opposite to each other. Specifically, the evaporation chambers having the two evaporation lines 100 are formed into a rectangular parallelepiped shape, and the two evaporation lines 100 are arranged oppositely on a rectangular annular track. The tray 3 can be moved in the direction indicated by the arrow in FIG. 1 (counterclockwise direction in FIG. 1). Thereby, the layout of the evaporation device 1000 can be further simplified, and the production efficiency can be guaranteed.

Optionally, at least one of the first delivery track 2 and the second delivery track is a ball bearing guide screw which can convert a rotary movement of the ball screw into a linear movement. Thereby, the linear movement of the tray 3 on the first delivery track 2 and/or the second delivery track can be conveniently realized with a simple structure and ingenious design.

According to some embodiments of the present disclosure, the evaporation line 100 further includes an inlet transition chamber 61. The workpiece 4 can be adapted to a transition from the atmospheric state to the vacuum state within the inlet transition chamber 61. For example, at the beginning of the evaporation, the workpiece 4 can be delivered into the inlet transition chamber 61, and then the inlet transition chamber 61 is evacuated to transform the inlet transition chamber 61 from the atmospheric state to the vacuum state, so that the workpiece 4 can be adapted the transition from the atmospheric state to the vacuum state, thereby ensuring a stable evaporation-deposition.

Specifically, the inlet transition chamber 61 is located at an upstream of the inlet 101 of the evaporation line, and at least one first alignment mechanism 71 is provided between the inlet transition chamber 61 and the inlet 101 of the evaporation line. The first alignment mechanism 71 is configured to pre-align the workpiece 4. For example, the first alignment mechanism 71 may align a platform center of the first alignment mechanism 71 with a center of the workpiece 4 or align the center of the workpiece 4 with a center of the bracket for pre-alignment. Specific alignment standards can be adjusted and designed according to the actual production practice. As a result, the position of the workpiece 4 can be preliminarily adjusted by the first alignment mechanism 71, which can prevent a large deviation of the workpiece 4 from the normal evaporation position, thereby simplifying the alignment process in the evaporation sub-chambers 11 and ensuring the evaporation-deposition effect. At the same time, the first alignment mechanism 71 is provided between the inlet 101 of the evaporation line and the inlet transition chamber 61, which reduces the space in evaporation sub-chambers 11 occupied by the first alignment mechanism 71.

Optionally, one or more first alignment mechanism 71 may be provided. The specific number of the first alignment mechanism 71 can be adjusted according to the actual practice. When there are provided a plurality of first alignment mechanisms 71, the plurality of first alignment mechanisms 71 may sequentially pre-align the workpiece 4, or at least one of the plurality of first alignment mechanisms 71 may be reserved for standby. When one of the plurality of first alignment mechanisms 71 is failed, the workpiece 4 can be aligned by the standby alignment mechanism to ensure the smooth production. Herein, any one of alignment devices in the prior art can be used as the first alignment mechanism 71, as long as it can realize the functions of the present disclosure.

Here, it should be noted that "upstream" as used in the present application means an upstream of the evaporation line 100 in the movement direction of the workpiece 4, and correspondingly, "downstream" in the present application refers to a downstream of the evaporation line 100 in the direction of movement of the workpiece 4.

Also, the evaporation line 100 further includes a mask plate 81. The mask plate 81 is provided between the workpiece 4 and the evaporation source component 5. Referring to FIG. 2, the mask plate 81 may be supported on a holder 82. The mask plate 81 has a pattern thereon. An area of the workpiece 4 on which the deposition is formed may correspond to the pattern on the mask plate 81. Thus, when the workpiece 4 is moved to above the evaporation source component 5, the pattern on the mask plate 81 may be formed on the workpiece 4 by the evaporation source component 5 during the evaporation-deposition.

In particular, a second alignment mechanism is provided in at least one of the evaporation sub-chambers 11, the second alignment mechanism is configured to position the workpiece 4 so as to align the area of the workpiece 4 on which the deposition is formed with the pattern of the mask plate 81. Specifically, the second alignment mechanism may be provided in some of the plurality of sub-chambers 11, or the second alignment mechanism may be provided in each of the sub-chambers 11. Preferably, the second alignment mechanism is provided in each of the evaporation sub-chambers 11. Therefore, the workpiece 4 can be precisely aligned by the second alignment mechanism so that the area of the workpiece 4 on which the deposition is formed is aligned with the pattern on the mask plate 81. As such, it is possible to improve the accuracy of the evaporation-deposition position, precisely realize the evaporation-deposition of each layer of films and improve the quality of the products.

In particular, referring to FIG. 2, the second alignment mechanism includes an alignment plate 721 and a controller 724. The alignment plate 721 may be formed in a square shape, the alignment plate 721 is located above the first delivery track 2, an alignment portion 7211 extending downward is provided in the alignment plate 721, and the controller 724 is connected to the alignment plate 721 and is configured to control movement of the alignment plate 721 so as to align the workpiece 4 by the alignment portion 7211. For example, the controller 724 may control the alignment plate 721 to move in up-down, front-rear and left-right directions, or may control the alignment plate 721 to rotate in a space to align the workpiece 4 through the alignment portion 7211.

According to some embodiments of the present disclosure, the second alignment mechanism further includes at least one image collector 722 connected to the controller 724, and the image collector 722 is configured to capture an image of the evaporation sub-chambers 11 to obtain a relative position of the workpiece 4 in relation to the mask plate 81 before and/or after the positioning/alignment performed by the second alignment mechanism. The controller 724 controls the alignment plate 721 to move according to the relative position obtained by the image collector 722. One or more image collectors 722 may be provided. The image collector 722 may be diposed on at least one of the top wall, the side wall, and the bottom wall of the evaporation sub-chamber 11. For example, when the workpiece 4 is moved to a position right above the mask plate 81, the controller 724 may control the alignment plate 721 to move according to the relative positions of the workpiece 4 in relation to the mask plate 81 such that the center of the workpiece 4 is positioned to the center of the mask plate 81 to align the area of the workpiece 4 on which the deposition is formed with the pattern of the mask plate 81 to complete the alignment, or the center of the workpiece 4 is positioned to the center of the holder 82 to align the area of the workpiece 4 on which the deposition is formed with the pattern of the mask 81 to complete the alignment. It can be understood that the specific alignment method can be adjusted and designed according to the actual practice, and the present disclosure is not intended to be limited thereto.

For example, in some embodiments of the present disclosure, the image collector 722 may obtain the image in the evaporation sub-chambers 11 before alignment to obtain the relative position of the workpiece 4 in relation to the mask plate 81. In this way, it is convenient for the controller 724 to control the movement of the alignment plate 721 according to the relative position of the workpiece 4 in relation to the mask plate 81, so as to precisely adjust the position of the workpiece 4 and improve the efficiency of alignment.

In some embodiments of the present disclosure, as another example, the image collector 722 may collect the image in the evaporation sub-chamber 11 after alignment so that the relative positions of the workpiece 4 in relation to the mask plate 81 can be obtained after alignment. In this way, the situation of the alignment can be fed back by the image collector 722. The controller 724 can determine whether the alignment is completed or not according to a feedback result from the image collector 722. If the alignment has not been completed yet, according to the relative position of the workpiece 4 in relation to the mask plate 81, the controller 724 can proceed to adjust the position of workpiece 4 until alignment is completed. As a result, the accuracy of alignment can also be improved.

As still another example, in some embodiments of the present disclosure, the image collector 722 may collect the images in the evaporation sub-chambers 11 before and after alignment, respectively, so that the controller 724 may control the movement of alignment plate 721 to align the workpiece 4 according to the relative position of the mask plate 81 in relation to workpiece 4 before the alignment, and determines whether the alignment is completed according to the relative positions of the aligned workpiece 4 in relation to the mask 81 after the alignment. As a result, accuracy and efficiency of alignment can be improved.

According to some embodiments of the present disclosure, the second alignment mechanism further includes an elastic adjustment mechanism 723 provided at the bottom of the tray 3. Optionally, the elastic adjustment mechanism 723 may be a spring, a flexible board, or etc. Thus, the position of the tray 3 in the horizontal and vertical directions can be adjusted by the elastic adjustment mechanism 723, so that the position of the workpiece 4 can be flexibly adjusted to align the workpiece 4.

Specifically, after the workpiece 4 is placed on the tray 3 at the inlet 101 of the evaporation line, pre-alignment can be performed by the first alignment mechanism 71 according to a standard. For example, the center of the workpiece 4 coincides with the platform center of the first alignment mechanism 71 to keep the workpiece 4 locked and then the workpiece 4 is smoothly moved through the ball bearing guide screw. When the workpiece 4 is moved to a position right above the mask plate 81, an alignment for the workpiece 4 can be performed by the second alignment mechanism. For example, by taking the coincidence of the center of the holder 82 of the mask plate 81 with the center of the workpiece 4 as the alignment standard, the relative position of the workpiece 4 in relation to the mask plate 81 is firstly obtained by the image collector 722, and then, according to the relative position of workpiece 4 in relation to the mask plate 81, the controller 724 controls the movement of the alignment plate 721. Next, the elastic adjustment mechanism 723 provided on the bottom of the tray 3 allows the controller 724 to adjust the position of the tray 3 in the horizontal and vertical directions to achieve a precise alignment. During the entire alignment process, the mask plate 81 remains stationary. The workpiece 4 is linearly moved within each of the evaporation sub-chambers 11 through the ball bearing guide screw track. The tray 3 can be finely adjusted in the horizontal and vertical directions by the elastic adjustment mechanism 723.

Further, an outlet transition chamber 62 may be provided at the outlet 102 of the evaporation line, and the outlet transition chamber 62 may be located downstream of the outlet 102 of the evaporation line. After the evaporation-deposition is completed, the workpiece 4 can be adapted to a transition from the vacuum state to the atmospheric state in the outlet transition chamber 62. For example, when the evaporation-deposition is completed, the workpiece 4 can be delivered into the outlet transition chamber 62 and then the outlet transition chamber 62 can be evacuated to transform the outlet transition chamber 62 from the vacuum state to the atmospheric state, so that the workpiece 4 can be adapted to the transition from the vacuum state to the atmosphere state to ensure the smooth progress of production.

Figure 7:
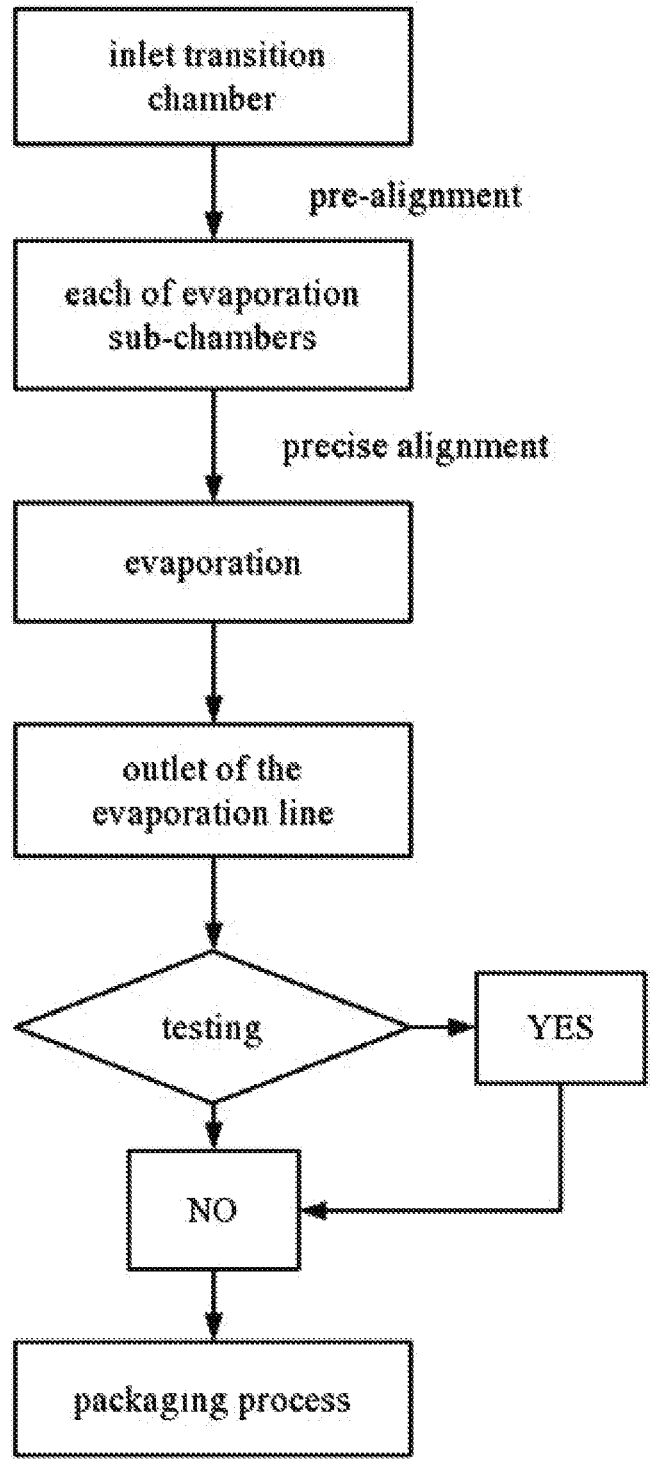
FIG. 7 is a flow chart of a tray delivery process in an evaporation method using the evaporation device according to an embodiment of the present disclosure.

In particular, a flow chart of the delivery of the workpiece 4 is shown in FIG. 7. The workpiece 4 is first at the inlet transition chamber 61 to adapt the transition from the atmospheric state to the vacuum state, then the workpiece 4 is delivered by the first mechanical manipulator 63 to the empty tray 3 to be pre-aligned by the first alignment mechanism 71, then the tray 3 together with the workpiece 4 is moved to a position where the center of the tray 3 corresponds to the center of the mask plate 81 in the evaporation sub-chamber 11, next the workpiece 4 is precisely aligned by the second alignment mechanism, and then the evaporation-deposition starts. The above steps are repeated until the the evaporation-deposition processes of all the evaporation sub-chambers 11 are completed. Then, the workpiece 4 is delivered to the outlet transition chamber 62 through the second mechanical manipulator 64, and in the end, the workpiece 4 is transported to the next process.

Specifically, the tray 3 further includes a side edge 32 connected to an outer periphery of the bracket, an upper surface of the workpiece 4 is lower than an upper end surface of the side edge 32. Here, it should be noted that the "outer periphery" in the present disclosure refers to the edge of the bracket away from the center of the bracket. The side edge 32 may be perpendicular to the bracket or substantially perpendicular to the bracket.

For example, when the bracket includes a plurality of sub-brackets 31, the side edge 32 may be connected to the left edge or the right edge of the sub-bracket 31. As a matter of course, the side edge 32 may also be connected to the front edge or the rear edge of the sub-bracket 31. As another example, when the bracket is formed as a one-piece frame structure, the side edge 32 may surround the outer periphery of the bracket.

Specifically, the upper surface of the workpiece 4 is lower than the upper end surface of the side edge 32, so that during the alignment process, the workpiece 4 can be aligned by the alignment portion 7211 of the second alignment mechanism in contact with the side edge 32, thereby preventing the alignment portion 7211 from a direct contact with the workpiece 4 during alignment process, effectively protecting the workpiece 4 and preventing the workpiece 4 from being damaged during alignment process.

Optionally, there may be provided two alignment portions 7211 which are arranged at an interval. Surfaces of the two alignment portions 7211 on the sides facing to each other extend obliquely in a direction far away from each other from top to bottom portion. Thus, the surfaces of the alignment portions 7211 can be formed as guide surfaces, so that the workpiece 4 can be aligned by contacting the guide surfaces with the side edge 32.

For example, in the example of FIG. 2, the two alignment portions 7211 may be provided on the lower surface of the alignment plate 721 at an interval in a left-right direction. The alignment portions 7211 may extend from a front end of the alignment plate 721 to a rear end of the alignment plate 721, and a thickness of the alignment portion 7211 gradually decreases from top to bottom portion thereof. For example, the cross-section of the alignment portion 7211 may be formed in a triangular, trapezoidal shape, etc. As a result, it is convenient for the alignment portion 7211 to contact with the side edge 32 to position the workpiece 4. Therefore, the structure thereof is simple while the processing is convenient. As a matter of course, it can be understood that the two alignment portions 7211 may also be arranged at an interval in a front-rear direction. In this case, the alignment portions 7211 may extend from the left end of the alignment plate 721 to the right end of the alignment plate 721.

In other embodiments of the present disclosure, there may be provided four alignment portions 7211, which correspond to the four brackets in sequentially. In a top-to-down direction, one side surface of the alignment portion 7211 adjacent to the bracket extends obliquely away from the bracket to form a guide surface. In this way, it is also convenient for the workpiece 4 to be positioned by the alignment portion 7211, which can save material consumption of the alignment portion 7211.

According to some embodiments of the present disclosure, referring to FIG. 1, the evaporation line 100 further includes a plurality of mask plate chambers 91. A plurality of mask plates 81 are provided in the each mask plate chamber. The plurality of mask plate chambers 91 are consistent with the plurality of evaporation sub-chambers 11 one by one. A passage is provided for connecting the mask plate chambers 91 and their corresponding evaporation sub-chambers 11. The mask plates 81 is movable in the connected passage so as to replace the mask plates 81 in the evaporation sub-chambers 11. Specifically, a large amount of evaporation source material adheres to the mask plate 81 during the evaporation process, which may affect the evaporation effect. After the evaporation is performed for a certain period of time, the mask plate 81 in the evaporation sub-chamber 11 can be replaced by the mask plate 81 in the mask plate chamber 91 to ensure the evaporation effect.

Further, the evaporation line 100 further includes a replacement device, which is movable between the mask plate chambers 91 and their corresponding evaporation sub-chambers 11, and which is configured to remove the mask plate 81 from the evaporation sub-chamber 11 and transport the mask plate 81 in the mask plate chamber 91 to the evaporation sub-chamber 11, so as to replace the mask plate 81 in evaporation sub-chamber 11. Specifically, referring to the FIGS. 4 and 5, the replacement device may include a push-pull rod 92 which is movable between the mask plate chambers 91 and their corresponding evaporation sub-chambers 11. A fitting hole 811 is provided at a side wall of the mask plate 81 adjacent to the push-pull rod 92. The push-pull rod 92 is suitable for inserting into the fitting hole 811 so as to draw the mask plate 81 along with the movement of the push-pull rod 92. In particular, the push-pull rod 92 can be extended into the evaporation sub-chamber 11 through the connected passage and be moved between the mask plate chamber 91 and its corresponding evaporation sub-chamber 11. Thus, the mask plate 81 in the evaporation sub-chamber 11 can be easily pulled out by the replacement device, and the mask plate 81 in the mask plate chamber 91 can be easily pushed into the evaporation sub-chamber 11 to complete the replacement, which is of simple structure and ingenious design.

Further, a shelf 93 is provided in the mask plate chamber 91. The shelf 93 is movable up and down relative to the mask plate chamber 91, and has a plurality of supporting tracks 931. The plurality of supporting tracks 931 are arranged at an interval in an up-down direction (i.e. a vertical direction). The mask plate 81 is slidably provided on the supporting tracks 931.

The supporting tracks 931 may be provided on two opposite surfaces of the shelf 93 in the up-down direction (i.e. vertical direction) at an interval. For example, referring to FIG. 5, the supporting tracks 931 may be provided on two opposite side walls of the shelf 93. During the replacement process, the shelf 93 may be moved in the up-down direction such that empty one of the supporting tracks 931 of the shelf 93 is aligned to the connected passage. Then the push-pull rod 92 is pushed into the evaporation sub-chambers 11 to allow the push-pull rod 92 to insert into fitting hole 811 on the mask plate 81 of the evaporation sub-chamber 11. The mask plate 81 in evaporation sub-chamber is pulled to the empty supporting track 931, and then move the shelf 93 in the up and down direction again, so that the supporting tracks 931 on which a unused mask plate 81 is placed are aligned to the connected passage. Then the push-pull rod 92 is extended into the fitting hole 811 of the unused mask plate 81, and in the end, the unused mask plate 81 is pushed from the connected passage into the evaporation sub-chamber 11 to complete the replacement.

Figure 4:
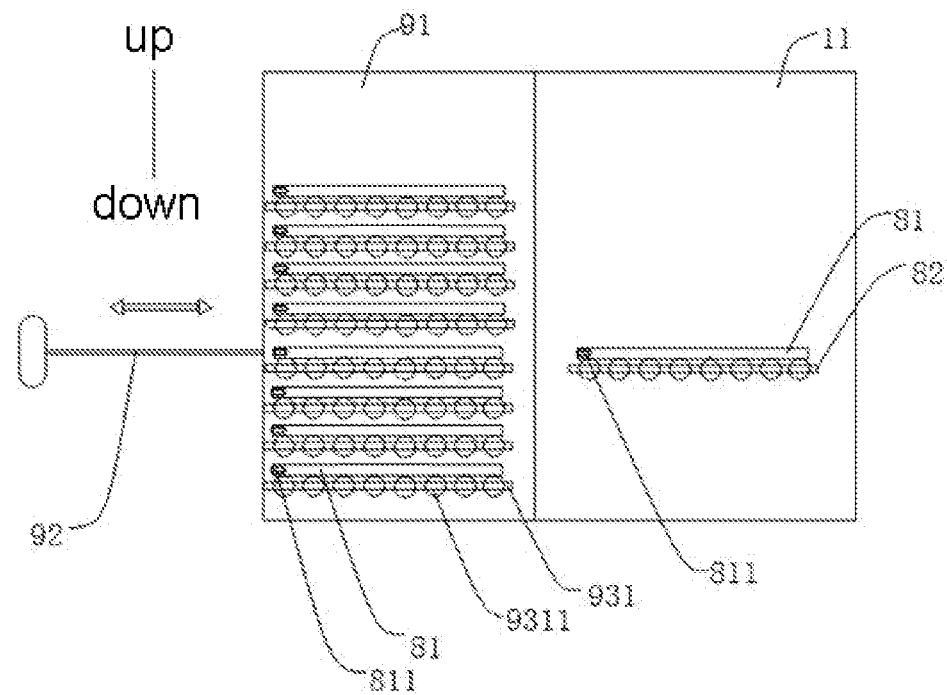
FIG. 4 is a schematic diagram of a mask plate chamber and an evaporation sub-chamber according to an embodiment of the present disclosure.
Figure 5:
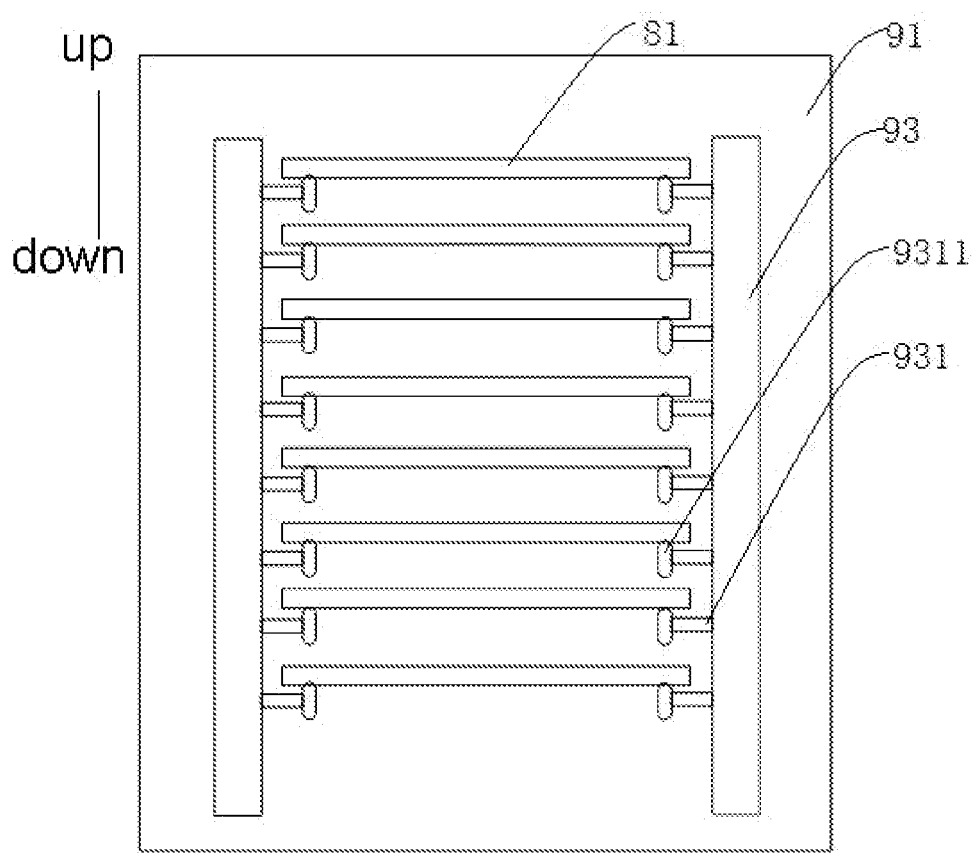
FIG. 5 is another schematic diagram of the mask plate chamber according to the embodiment of the present disclosure.
Figure 6:
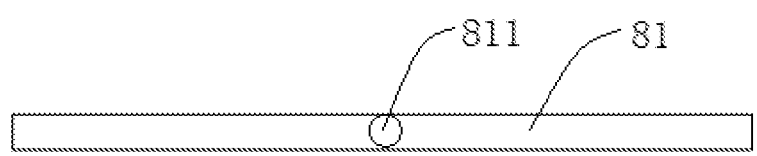
FIG. 6 is a schematic structural view of the mask plate according to the embodiment of the present disclosure.

Specifically, the supporting track 931 is provided with a roller 9311 on which the mask plate 81 is slidably provided. Referring to FIG. 4, a plurality of rollers 9311 may be provided on each supporting track 931. Thereby, the friction force of the mask plate 81 on the supporting track 931 can be reduced, so that the mask plate 81 in the evaporation sub-chamber can be replaced more easily.

According to some embodiments of the present disclosure, the evaporation source component 5 in at least one evaporation sub-chamber 11 includes a plurality of evaporation sources 51, and at least one of the plurality of evaporation sources 51 is a standby evaporation source 51. Specifically, the evaporation source component 5 in some of the evaporation sub-chambers 11 may include the plurality of evaporation sources 51, or the evaporation source component 5 in each of the evaporation sub-chambers 11 includes the plurality of evaporation source 51. Since the evaporation chamber remains in a vacuum environment, when the evaporation source 51 fails, it is required to wait until the temperature of the evaporation source 51 cools down to a certain temperature before opening the vacuum chamber prior to release the vacuum. In this way, a long time is needed and hours are taken to vacuum after resolving the problem, which may cause a delay in production.

Therefore, the standby evaporation source 51 is provided in the evaporation sub-chamber 11. When one of the evaporation sources 51 fails, for example, when the evaporation rate of the evaporation source 51 is unstable, disconnected or etc., on one hand, the standby evaporation source 51 can be immediately activated to perform the evaporation so as to avoid the stagnation of the production line due to the failure of the evaporation source 51, thereby saving the maintenance time and improving the ability of the evaporation device 1000 to deal with emergent conditions, improving the stability and risk resistance of the evaporation device 1000, and ensuring the continuity of production. On the other hand, when the evaporation material in one of the evaporation sources 51 is almost exhausted, the standby evaporation source 51 may also be activated for evaporation, which provides a longer production time and improves the production efficiency.

It can be understood that since a small molecule organic material is used as the evaporation material, which cannot be stored at a high temperature for a long time or the evaporation material may be deteriorated. When the evaporation material in one of the above evaporation sources 51 is about to run out or the evaporation rate thereof is unstable, the standby evaporation source 51 can be pre-heated to ensure the smooth production.

For example, in one embodiment of the present disclosure, two robotic arms 52 are provided in each of the evaporation sub-chambers 11, and each of the robotic arms 52 is provided with an evaporation source 51. One of the two evaporation sources 51 is the standby evaporation source 51.

Specifically, a gate 111 is provided between two adjacent evaporation sub-chambers 11. The gate 111 is switchable between an open state and closed state. When the gate 111 is opened, the tray 3 is moved from either one of the two evaporation sub-chambers 11 to the other. For example, when the tray 3 is moved to the gate 111, the gate 111 can be switched to an open state so that the tray 3 can be smoothly delivered into the next evaporation sub-chamber 11. After the tray 3 passes through the gate 111, the gate 111 can be switched to the closed state. Thus, by providing the gate 111 between the evaporation sub-chambers 11, the evaporation sub-chambers 11 can be separated from each other and the tray 3 can conveniently move between evaporation sub-chambers 11. When gas leakage or other failure, occurs in one of the evaporation sub-chambers 11, a range of the failure can be quickly locked, which facilitates the overhaul and prevents the evaporation sub-chamber in failure from affecting the others.

Other configurations and operations of the evaporation device 1000 according to the embodiments of the present disclosure are known to those of ordinary skilled in the art and will not be described in detail herein.

According to a second aspect of the present disclosure, an evaporation method using the evaporation device 1000 will be described hereinafter. The evaporation device 1000 may be the evaporation device 1000 in the first aspect of the present disclosure. Specifically, the evaporation method using the evaporation device 1000 may include steps of:

placing the workpiece on the tray located at the inlet of the evaporation line;

driving the workpiece into the evaporation chamber along with the tray and moving through the plurality of evaporation sub-chambers successively so as to form the deposition on the workpiece;

operating the deposited workpiece to move to the outlet of the evaporation line along with the tray; and removing the deposited workpiece from the tray and transporting it to a next process.

As a result, the workpiece 4 can be moved on the first delivery track 2 by means of the tray 3 on the first delivery track 2 to be delivered between the evaporation sub-chambers 11 without any mechanical manipulators in the related art for delivering the workpiece 4 between the evaporation sub-chambers 11 and the delivery process between the evaporation sub-chambers 11 using the mechanical manipulators. Thus, it is possible to simplify the operative steps, decrease the risk of damaging the workpiece 4 during the delivery process, and reduce the deviation between the workpiece 4 and the normal deposition position. This in turn can reduce the difficulty of the alignment process, optimize the layout of the evaporation line 100 and improve the space utilization efficiency, thereby allowing for a more compact structure and appropriate evaporation line 100, and further decreasing the occupied space and cost of the whole evaporation device 1000.

According to some embodiments of the present disclosure, before driving the workpiece into the evaporation chamber along with the tray, the method includes a step of pre-aligning the workpiece 4. As a result, the position of the workpiece 4 can be preliminarily aligned, thereby simplifying the alignment process in the evaporation sub-chambers 11 and ensuring the evaporation-deposition effect. At the same time, the workpiece 4 is pre-aligned before driven into the evaporation chamber along with the tray, which reduces the space occupied by the alignment mechanism in the evaporation sub-chamber 11.

Further, after driving the workpiece into the evaporation chamber and before forming the deposition on the workpiece 4, the method includes a step of: aligning the workpiece 4 finely. As a result, the evaporation effect can be ensured, the accuracy of the deposition position can be improved, the evaporation of thin films on each layer can be accurately obtained, and the quality of the products can be improved.

According to some embodiments of the present disclosure, after removing the deposited workpiece from the tray, the method further includes a step of: moving the tray 3 from the outlet 102 of the evaporation line to the inlet 101 of the evaporation line. As a result, the tray 3 can be circulated on the evaporation line 100, the utility ratio of the tray 3 can be increased, and the automation and production efficiency of the evaporation line 100 can be improved.

According to the second aspect, the evaporation method using the evaporation device 1000 in the embodiments of the present disclosure can provide a simple operation, reduce the difficulty of editing the control program, enhance the reliability, and ensure the smooth production.

In the description of the specification, the description with reference to the terms "one embodiment", "some embodiments", "exemplary embodiments", "an example", "specific examples", or "some examples" means specific features, structures, materials, or characteristics described by examples or examples are included in at least one embodiment or example of the present disclosure. In this specification, the schematic representation of the above terms does not necessarily refer to the same embodiment or example. Furthermore, the particular features, structures, materials, or characteristics described may be combined in any suitable manner in any one or more embodiments or examples.

Although the embodiments of the present disclosure have been shown and described, it will be understood by those of ordinary skill in the art that various changes, modifications, alterations, and modifications may be made to these embodiments without departing from the principle of the present disclosure, and the scope of the disclosure is defined by the claims and their equivalents.

The invention claimed is:

1. An evaporation device for a workpiece, comprising:
at least one evaporation line, which includes an evaporation chamber including a plurality of evaporation sub-chambers connected in sequence, an inlet of the at least one evaporation line being formed on one end of the evaporation chamber, an outlet of the at least one evaporation line being formed on the other end of the evaporation chamber, and an evaporation source component being provided in the evaporation chamber;
a first delivery track, which is arranged between the inlet of the at least one evaporation line and the outlet of the at least one evaporation line, the first delivery track being located above the evaporation source component; and
a tray for placing the workpiece, which is movably provided on the first delivery track to deliver the workpiece between the inlet of the at least one evaporation line and the outlet of the at least one evaporation line so as to form deposition on the workpiece by the evaporation source component;
wherein the at least one evaporation line further comprises:
an inlet transition chamber located at an upstream of the inlet of the at least one evaporation line, at least one first alignment mechanism being provided between the inlet transition chamber and the inlet of the at least one evaporation line, and the at least one first alignment mechanism being configured to pre-align the workpiece;
a mask plate provided between the workpiece and the evaporation source component; and
a second alignment mechanism provided in at least one of the evaporation sub-chambers, and configured to position the workpiece so as to align an area of the workpiece on which the deposition is formed with a pattern of the mask plate,
wherein the second alignment mechanism comprises:
an alignment plate located above the first delivery track and provided with at east one alignment portion extending downwardly;
a controller connected to the alignment plate and configured to control movement of the alignment plate so as to position the workpiece by the alignment portion; and
an elastic adjustment mechanism provided at a bottom of the tray.

2. The evaporation device according to claim 1, further comprising:
a second delivery track provided outside the evaporation chamber, the second delivery track and the first delivery track forming an annular track so as to allow the tray to circularly move between the inlet of the at least one evaporation line and the outlet of the at least one evaporation line.

3. The evaporation device according to claim 2, wherein a plurality of evaporation lines are formed, the second delivery track is connected between two adjacent evaporation lines, one end of the second delivery track is connected to the outlet of either one of the two adjacent evaporation lines, and the other end of the second delivery track is connected to the inlet of the other one of two adjacent evaporation lines, such that the plurality of evaporation lines form the annular track.

4. The evaporation device according to claim 1, wherein two alignment portions are arranged at an interval, surfaces of the two alignment portions on the sides facing to each other extending obliquely in a direction far away from each other in an up and down direction.

5. The evaporation device according to claim 1, wherein the second alignment mechanism further comprises:
an image collector connected to the controller for obtaining a relative position of the workpiece in relation to the mask plate by collecting an image in the evaporation sub-chambers.

6. The evaporation device according to claim 1, wherein the at least one evaporation line further comprises:
a plurality of mask plate chambers, a plurality of mask plates being provided in each of the plurality of mask plate chambers, the plurality of mask plate chambers corresponding to the plurality of evaporation sub-chambers one by one, a connected passage being provided between the mask plate chambers and their corresponding evaporation sub-chambers, and the mask plates being movable in the connected passage so as to replace the mask plates in the evaporation sub-chambers; and
a replacement device movable between the mask plate chambers and their corresponding evaporation sub-chambers, and configured to remove a mask plate in one of the evaporation sub-chamber and transport a mask plate in a corresponding mask plate chamber to the evaporation sub-chamber so as to replace the mask plate in the evaporation sub-chamber.

7. The evaporation device according to claim 6, wherein the replacement device comprises:
a push-pull rod movable between the mask plate chambers and their corresponding evaporation sub-chambers, a fitting hole being provided on a side wall of the mask plate adjacent to the push-pull rod such that the push-pull rod is able to insert into the fitting hole so as to draw the mask plate.

8. The evaporation device according to claim 6, wherein a shelf is provided in the mask plate chambers and movable in an up and down direction relative to the mask plate chambers, and
the shelf has a plurality of supporting tracks which are provided on two opposite surfaces of the shelf at an interval in a vertical direction.

9. The evaporation device according to claim 8, wherein the supporting tracks have a roller which slidably supports the mask plate.

10. The evaporation device according to claim 1, wherein the tray further comprises:
a bracket for placing the workpiece; and
a side edge connected to an outer periphery of the bracket, wherein an upper surface of the workpiece is lower than an upper end surface of the side edge.

11. The evaporation device according to claim 8, wherein the evaporation source component in at least one of the evaporation sub-chambers comprises a plurality of evaporation sources, and at least one of the plurality of evaporation sources is a standby evaporation source.

12. The evaporation device according to claim 3, wherein at least one of the first delivery track and the second delivery track includes a ball bearing guide screw.

13. The evaporation device according to claim 3, wherein an arrangement of the plurality of evaporation sub-chambers of the at least one evaporation line is a straight line.

14. The evaporation device according to claim 3, wherein the annular track is formed as a polygonal track.

15. The evaporation device according to claim 14, wherein a shape of the polygonal track is square.

16. An evaporation method using the evaporation device according to claim 1, comprising:
- placing the workpiece on the tray located at the inlet of the at least one evaporation line;
- driving the workpiece into the evaporation chamber along with the tray and moving through the plurality of evaporation sub-chambers successively so as to form the deposition on the workpiece;
- operating the deposited workpiece to move to the outlet of the at least one evaporation line along with the tray; and
- removing the deposited workpiece from the tray and transporting it to a next process.

* * * * *